(12) United States Patent
Tsai et al.

(10) Patent No.: US 9,628,115 B1
(45) Date of Patent: Apr. 18, 2017

(54) WIRELESS COMMUNICATION DEVICE

(71) Applicant: HTC CORPORATION, Taoyuan (TW)

(72) Inventors: Tiao-Hsing Tsai, Taoyuan (TW);
Chien-Pin Chiu, Taoyuan (TW);
Hsiao-Wei Wu, Taoyuan (TW);
Yi-Hsiang Kung, Taoyuan (TW);
Li-Yuan Fang, Taoyuan (TW)

(73) Assignee: HTC CORPORATION, Taoyuan (TW)

( * ) Notice: Subject to any disclaimer, the term of this patent is extended or adjusted under 35 U.S.C. 154(b) by 0 days.

(21) Appl. No.: 15/094,684

(22) Filed: Apr. 8, 2016

(51) Int. Cl.
*H04M 1/00* (2006.01)
*H04B 1/00* (2006.01)
*H04W 16/14* (2009.01)

(52) U.S. Cl.
CPC .......... *H04B 1/0064* (2013.01); *H04W 16/14* (2013.01)

(58) Field of Classification Search
CPC .......... H01Q 1/38; H01Q 1/521; H01Q 1/243; H01Q 5/50; H01Q 9/0435; H04M 1/0262; H04M 1/0274
See application file for complete search history.

(56) References Cited

U.S. PATENT DOCUMENTS

| | | | |
|---|---|---|---|
| 5,661,493 A * | 8/1997 | Uher | H01Q 5/42 343/700 MS |
| 9,065,175 B2 * | 6/2015 | Corbin | H01Q 1/243 |
| 2014/0166350 A1 * | 6/2014 | Rappoport | H01Q 1/38 174/258 |
| 2015/0311960 A1 * | 10/2015 | Samardzija | G06F 1/163 455/90.3 |
| 2016/0261023 A1 * | 9/2016 | Di Nallo | H01Q 1/24 |

* cited by examiner

*Primary Examiner* — Sonny Trinh
(74) *Attorney, Agent, or Firm* — Masuvalley & Partners

(57) ABSTRACT

A wireless communication device that has a circuit board, an RF signal module, a capacitive touch-sensing component and an antenna component is provided. The touch-sensing signal module is disposed on the circuit board. The capacitive touch-sensing component includes a sensing layer and a ground layer. The sensing layer is electrically connected to the touch-sensing signal module. The antenna component includes a feed point and a radiating body. The feed point is disposed on the ground layer and is electrically connected to the RF single module. The radiating body incorporates at least parts of the ground layer. Alternatively, the feed point is disposed on the sensing layer, and the radiating body incorporates at least parts of the sensing layer. Therefore, the radiating body is incorporated into the sensing layer or ground layer of the capacitive touch-sensing component and can save accommodating space.

23 Claims, 8 Drawing Sheets

WIRELESS COMMUNICATION DEVICE

BACKGROUND OF THE INVENTION

Field of the Invention

The present invention provides a wireless communication device, and in particular, it provides a wireless communication device with an antenna component integrated with an input component.

Descriptions of the Related Art

Wireless communication technology has been widely used in various electronic products. In particular, smart phones and tablet computers use wireless RF (radio frequency) signals of various different frequencies. Therefore, electronic products, such as smart phones and the tablet computers, usually need various antennae to receive and transmit various wireless RF signals.

However, when the number of antennae increases, the layout of the antennae in electronic products becomes difficult. Researchers have to consider, among other problems, locations where the antennae should be disposed within the electronic products to achieve higher efficiency without occupying the accommodating spaces of other electronic components/modules. Moreover, as electronic products become increasingly thinner, the available space inside the electronic products have become more limited and thus, the layout of the antennae is more difficult.

Accordingly, a need exists in the art to provide an antenna with desired frequencies in the limited available space within electronic products.

SUMMARY OF THE INVENTION

An objective of the present invention is to provide a wireless communication device which can have an antenna component integrated with an input component (e.g., touch-sensing components such as a capacitive touch-sensing component) to reduce the space required for accommodating the antenna component.

Another objective of the present invention is to provide another wireless communication device, which can have an antenna component integrated with the input component and prevent mutual interference between signals of the antenna component and input component. To achieve the aforesaid objectives, a wireless communication device disclosed in the present invention comprises: a circuit board, comprising a first ground layer; a first input component, comprising a sensing layer, a dielectric layer and a second ground layer, the sensing layer being electrically connected to the first ground layer, the dielectric layer being disposed between the sensing layer and the second ground layer, and the second ground layer being electrically connected to the first ground layer; and an antenna component, comprising a feed point and a radiating body, the feed point being disposed on the second ground layer of the input component, and at least parts of the second ground layer forming a first part of the radiating body.

To achieve the aforesaid objectives, a wireless communication device disclosed in the present invention comprises: a circuit board, comprising a ground layer; a plurality of electronic components, being disposed on the circuit board and comprising an RF signal module and a touch-sensing signal module; a touch-sensing signal conducting wire and an RF signal conducting wire, an end of the touch-sensing signal conducting wire being electrically connected to the touch-sensing signal module, and an end of the RF signal conducting wire being electrically connected to the RF signal module; a capacitive touch-sensing component, comprising a sensing layer which is electrically connected to another end of the touch-sensing signal conducting wire; and an antenna component, comprising a feed point and a radiating body, the feed point being disposed on the sensing layer of the capacitive touch-sensing component and electrically connected to another end of the RF signal conducting wire, wherein the radiating body comprises at least parts of the sensing layer.

To achieve the aforesaid objectives, a wireless communication device disclosed in the present invention comprises: a circuit board, comprising a ground layer; a touch-sensing signal conducting wire and an RF signal conducting wire, a first end of the touch-sensing signal conducting wire being electrically connected to the ground layer, and a first end of the RF signal conducting wire being electrically connected to the ground layer; an input component, comprising a sensing layer which is electrically connected to a second end of the touch-sensing signal conducting wire; and an antenna component, comprising a feed point and a radiating body, the feed point being disposed on the sensing layer of the input component, and a second end of the RF signal conducting wire being electrically connected to the sensing layer via the feed point, wherein at least parts of the sensing layer form a first part of the radiating body.

The aforesaid wireless communication device may further comprise a touch-sensing signal filter and an RF signal filter. The touch-sensing signal filter is electrically connected to the RF signal conducting wire to block the touch-sensing signal from propagating through the RF signal conducting wire. The RF signal filter is electrically connected to the touch-sensing signal conducting wire to block an RF signal from propagating through the touch-sensing signal conducting wire.

Accordingly, the wireless communication device has at least has the following technical benefits. The radiating body of the antenna component comprises at least a part of the sensing layer or the ground layer of the capacitive touch-sensing component (or other input components), and uses the sensing layer or the ground layer to receive and transmit RF signals, thereby, saving the space required for accommodating the radiating body. In other words, the "sensing layer or the ground layer" and the radiating body share a common space, which prevents the radiating body from occupying the limited space within the device or makes the radiating body occupy less space within the device.

Additionally, the touch-sensing signal filter can block the touch-sensing signal generated by the capacitive touch-sensing component (or other input components) from entering into the RF signal module, so the touch-sensing signal is unlikely to affect the RF signal module. The RF signal filter can block the RF signal in the antenna component from entering into the touch-sensing signal module, so the RF signal is unlikely to affect the touch-sensing signal module. Therefore, the wireless communication device can be more reliable in performing the touch-sensing and wireless communication functions.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

Figure 1:
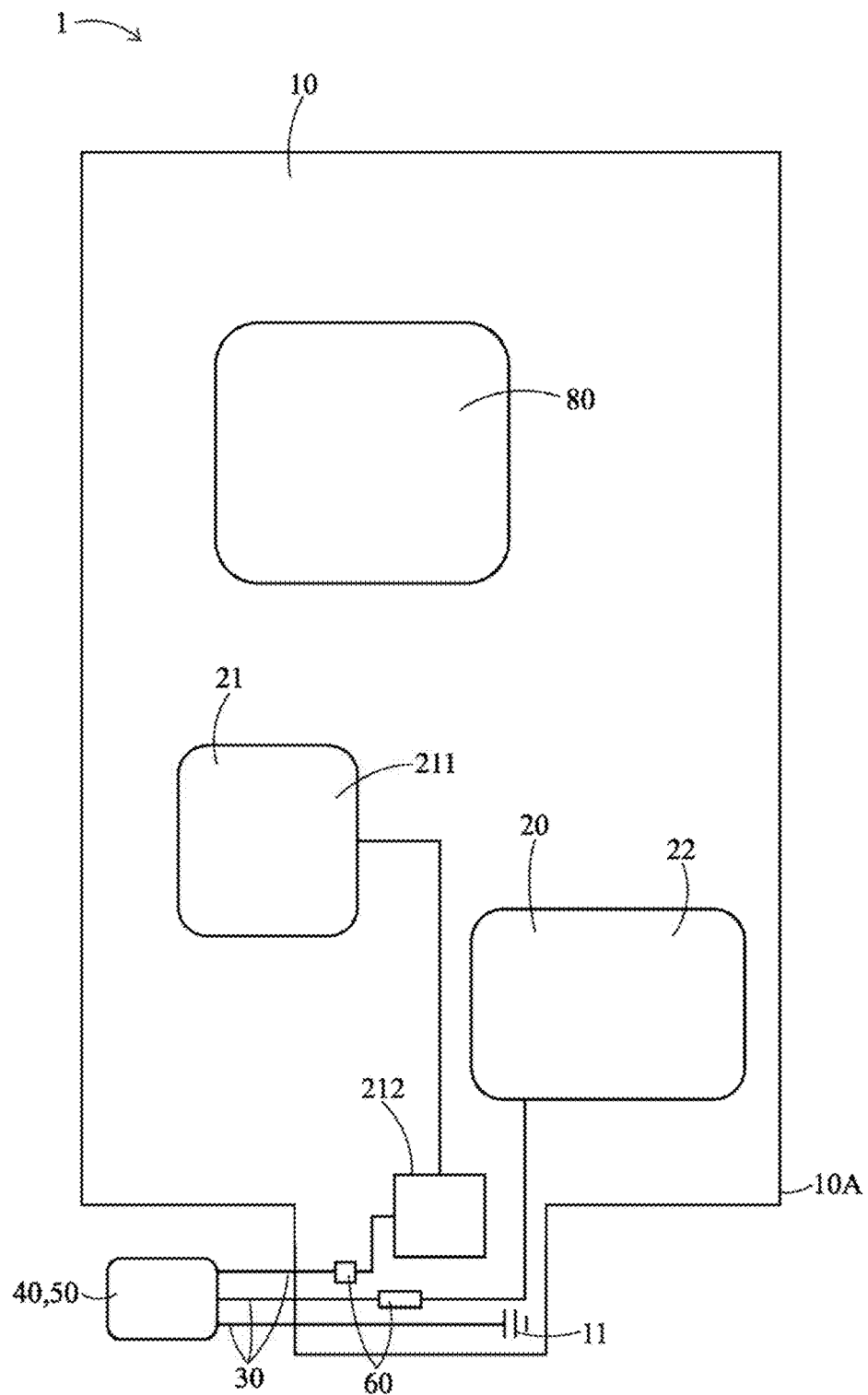
FIG. 1 is a schematic view of a wireless communication device according to the first preferred embodiment of the present invention.
Figure 2:
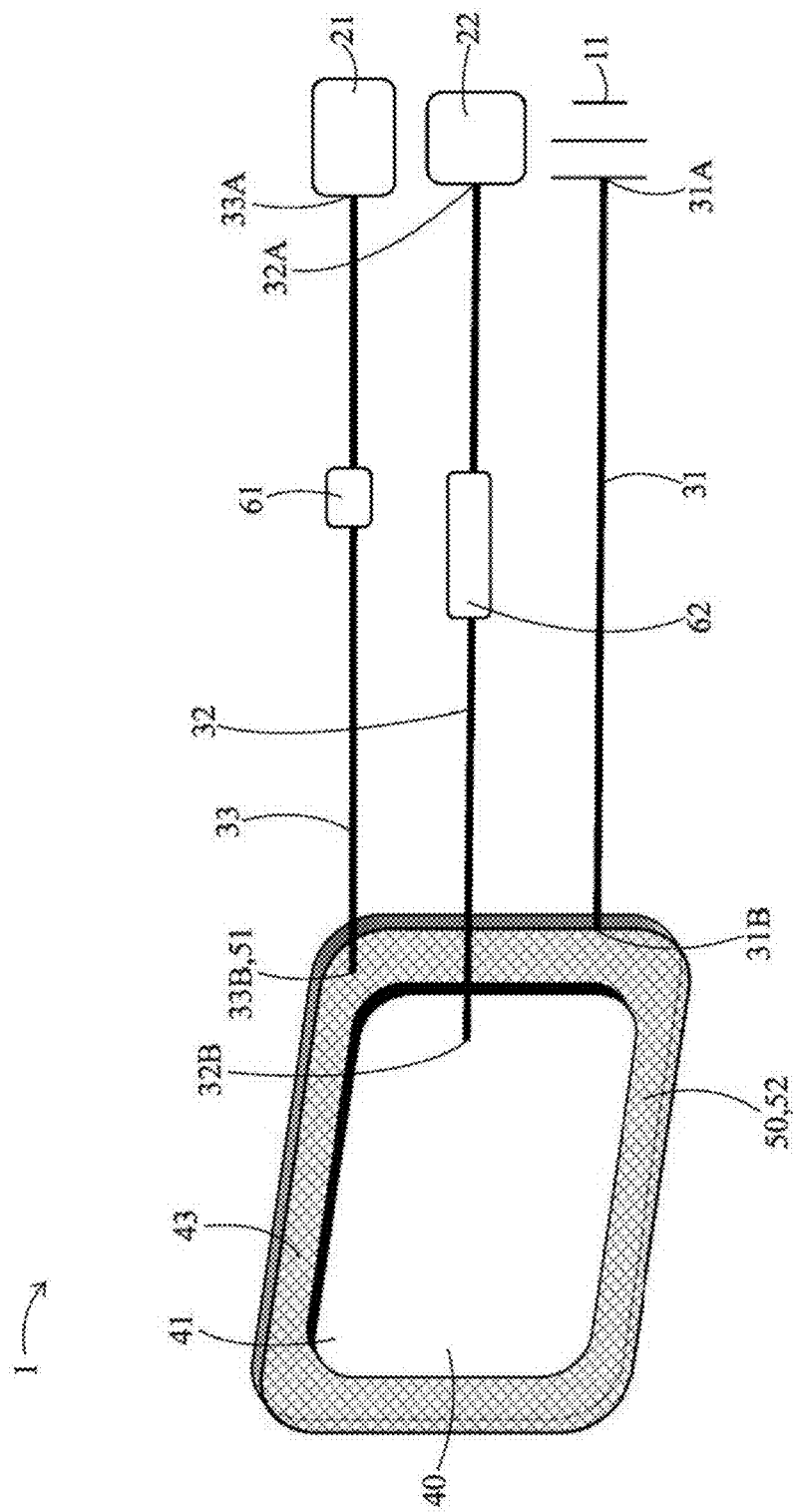
FIG. 2 is a schematic view of parts of components in FIG. 1.
Figure 3:
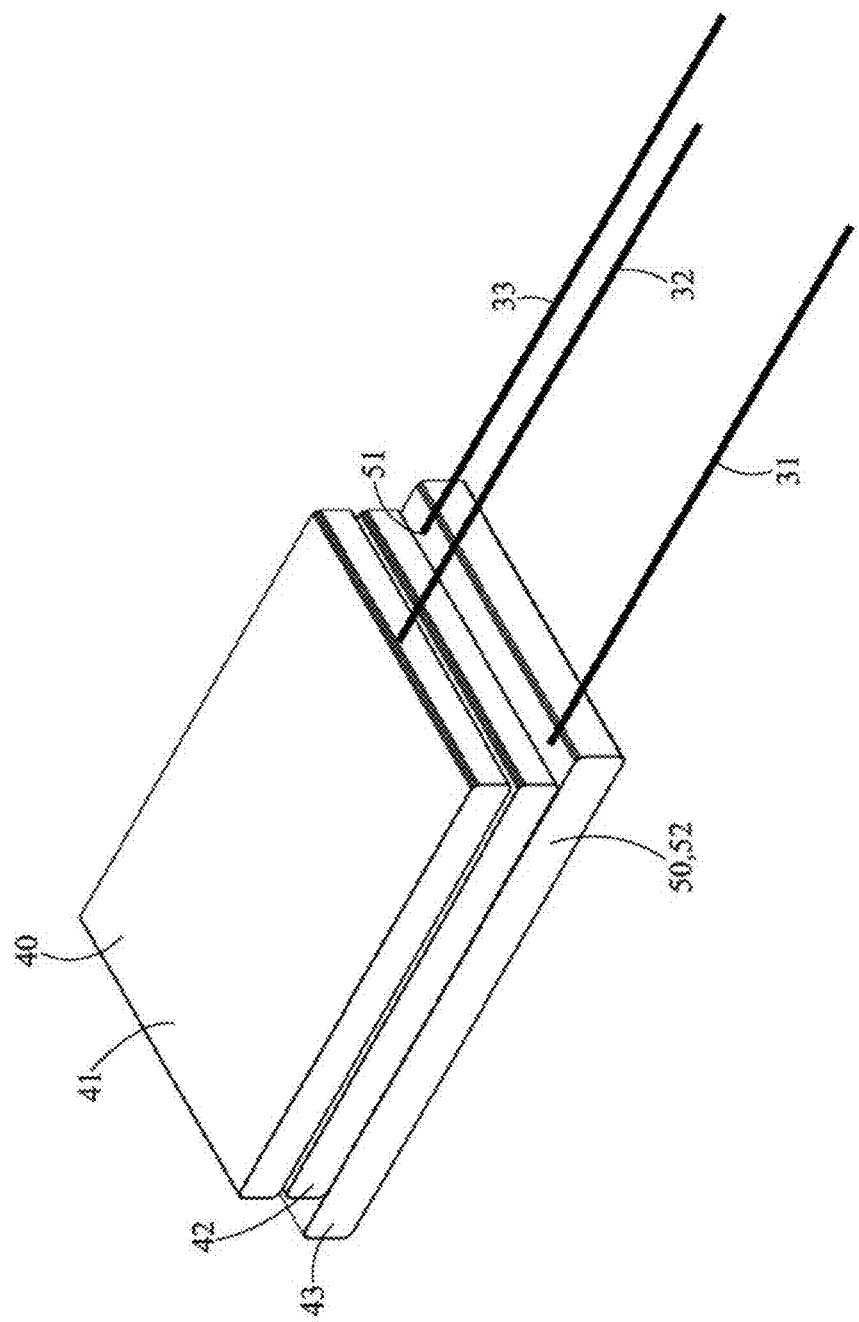
FIG. 3 is another schematic view of parts of components in FIG. 1.

FIGS. 1 to 3 are schematic views of a wireless communication device according to the first preferred embodiment of the present invention. The wireless communication device 1 may be an electronic product capable of wireless communication or a part an electronic product (e.g., a smart phone or a tablet computer or the like) and may transmit data via appropriate communication protocols (e.g., 3G; 4G; 5G; Wi-Fi, BT, and LTE).

Figure 8:
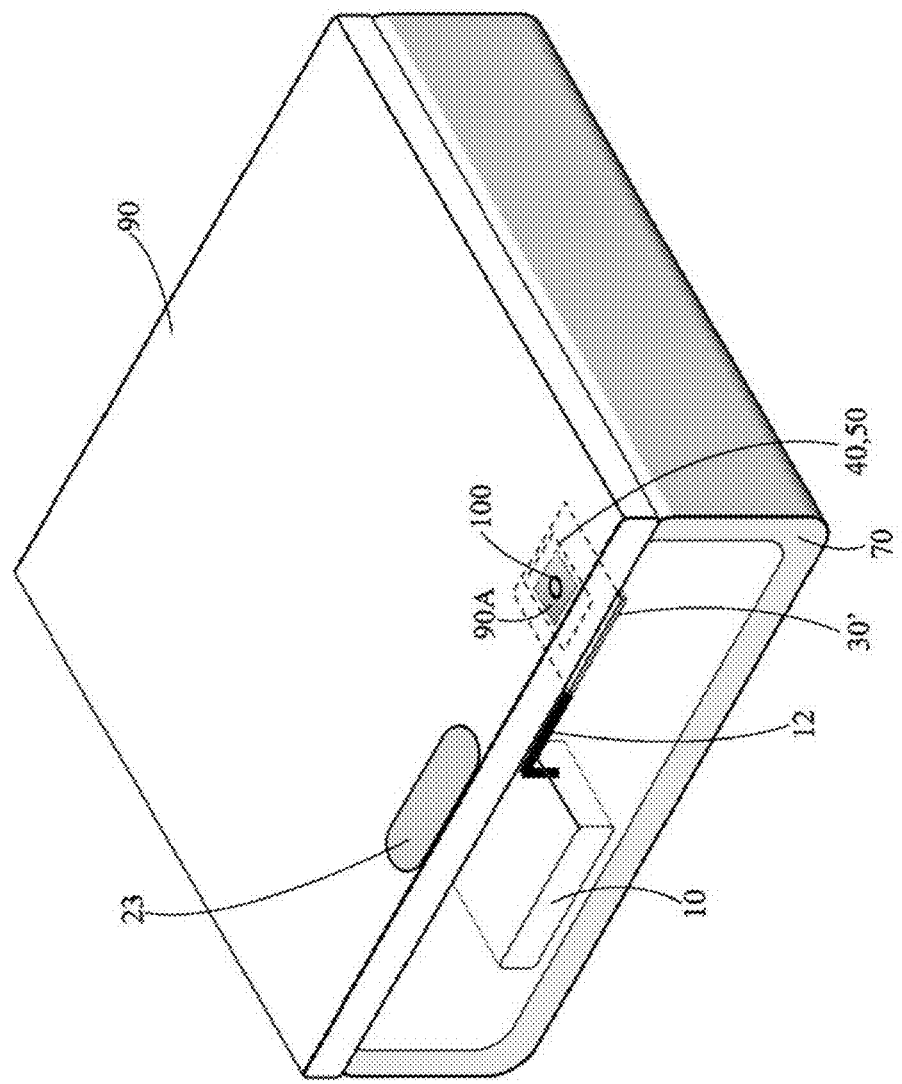
FIG. 8 is yet another schematic view of parts of components in FIG. 1.

The wireless communication device 1 may comprise a circuit board 10, a plurality of electronic components 20, a plurality of conducting wires 30, at least one input component 40, an antenna component 50, a back cover 70, a cover glass 90 (as shown in FIG. 8) and at least one processor 80. Preferably, the wireless communication device 1 may further comprise one or more signal filters 60 (or called filters). The back cover 70 and the cover glass 90 are parts for forming the overall appearance of the wireless communication device 1. The back cover 70 may be made of a non-conductor, a conductor or a combination of a conductor and a non-conductor.

The input component 40 is configured to sense the input of a user and may comprise one of the following components: a capacitive touch-sensing component, a resistive touch-sensing component, an inductive touch-sensing component and an optical touch-sensing component. The input component 40 senses the input of the user in combination with the cover glass 90 on a touch-sensing display panel module (not shown). In this embodiment, the input component 40 is implemented as a capacitive touch-sensing component. The technical contents of those components will be sequentially described as follows.

As shown in FIG. 1, the circuit board 10 may be a main circuit board inside the electronic product and may have most of the electronic components 20 disposed thereon. Some mechanical members (e.g., the frame for supporting the touch-sensing display panel module, an electric connector or the like that are not shown in FIG. 1) may also be disposed on the circuit board 10. The circuit board 10 is generally rectangular in appearance, and the periphery 10A thereof may have a protruding portion or a concave portion. In practical application, the shape of the circuit board 10 is not limited thereto, and the circuit board 10 may also have other shapes.

Structurally, the circuit board 10 may comprise a circuit pattern layer (not shown) so that the electronic components 20 can be electrically connected with each other directly or indirectly to transmit electrical signals therebetween. The circuit board 10 further comprises one or more ground layers 11 that may be disposed on the outer layer or inner layer (i.e., not exposed to the outside) of the circuit board 10. The ground layer 11 may be a metal layer, e.g., a copper foil layer.

The electronic components 20 may be disposed on the circuit board 10, e.g., via solder or the electric connector (not shown) and may be electrically connected with the circuit pattern layer and/or the ground layer 11 of the circuit board 10. The electronic components 20 at least comprise an RF signal module 21 and a touch-sensing signal module 22 that are electrically connected with the processor 80. The RF signal module 21 (also known as the RF control module) is configured to receive and transmit an RF signal (also known as the RF microwave signal), and is electrically connected to other electronic components associated with the wireless communication to further process the RF signal via the processor 80, e.g., perform the conversion between the RF signal and the digital signal, power amplification or the like. The RF signal module 21 may comprise one or more chips 211 and may also comprise an impedance matching circuit 212. The RF signal module 21 may also be integrated into a chip with other electronic components.

The touch-sensing signal module 22 (also known as the touch-sensing control module) and the processor 80 may be configured to process the touch-sensing signal from the touch-sensing display panel module and the input component (i.e., the capacitive touch-sensing component) 40, e.g., determine the electric capacity of the capacitive touch-sensing component 40 according to the current of the touch-sensing signal, determine whether the capacitive touch-sensing component 40 is touched according to the electric capacity, or the like. The touch-sensing signal module 22 may also drive the capacitive touch-sensing component 40. As described above, the touch-sensing signal module 22 may also be electrically connected with other electronic components to transmit the determination result to the electronic component for further use. The touch-sensing signal module 22 may comprise one or more chips and may also be integrated with other electronic components.

Depending on the practical applications or requirements, the electronic components 20 may also comprise a memory, a battery, a touch-sensing display panel, various sensors and/or signal processing chips or the like (not shown) to provide various functions for the wireless communication device 1.

With references to FIGS. 2, 3 and 8, the conducting wires 30 are configured to transmit electrical signals to the circuit board 10, the electronic components 20, the capacitive touch-sensing component 40 and/or the antenna component 50. The conducting wires 30 comprise a ground conducting wire 31, a touch-sensing signal conducting wire 32 and an RF signal conducting wire 33. Each of the conducting wires 31 to 33 may be a circuit pattern layer printed on the circuit board 10 and/or a metal wire independent of the circuit board 10. As shown in FIG. 8, the independent metal wire may be disposed on a flexible printed circuit substrate (FPCB) 30'. The flexible printed circuit substrate 30' may also be electrically connected with the circuit board 10 via a conducting wire 12. Structurally, the flexible printed circuit substrate 30' is disposed below the cover glass 90.

Additionally, each of the conducting wires 31 to 33 comprises two opposite ends (i.e., an end 31A and another end 31B, an end 32A and another end 32B, and an end 33A and another end 33B) in which the electrical signal can be transmitted therebetween. The ground conducting wire 31 has an (first) end 31A electrically connected to the ground layer 11 of the circuit board 10 and another (second) end 31B electrically connected to the capacitive touch-sensing component 40. The touch-sensing signal conducting wire 32 has an (first) end 32A electrically connected to the touch-sensing signal module 22 and another (second) end 32B electrically connected to the capacitive touch-sensing component 40. The RF signal conducting wire 33 has an (first end) end 33A electrically connected to the RF signal module 21 and another (second) end 33B electrically connected to the antenna component 50.

The capacitive touch-sensing component 40 may define a capacitance value and may vary the capacitance value in response to the approach of a conductor (e.g., the finger of the user), and then the touch-sensing signal module 22 can sense the variation of the capacitance value to determine whether the capacitive touch-sensing component 40 is touched. In this way, the user can transmit a specific instruction to the wireless communication device 1 by touching the capacitive touch-sensing component 40. As shown in FIG. 1, the capacitive touch-sensing component 40 may be optionally disposed at the side of the periphery A of the circuit board 10 and be separated from the circuit board 10. The capacitive touch-sensing component 40 may be a key, a scroll bar, a wheel, a pad or the like.

With reference to FIG. 8, keys may be classified into physical keys and virtual keys depending on the structural design thereof, and both kinds of keys may each have a specific pattern 100 disposed thereon for the user to identify the function thereof. Both kinds of keys may be combined with the cover glass 90 on the touch-sensing display panel module (not shown) to form an input sensing area 90A for sensing and receiving the input of the user. The sensing area 90A is dependent on the position of the input component 40 and is not limited to the fixed position on the cover glass 90.

Technically, if the pattern 100 disposed on the key cannot be seen when the display panel module within the touch-sensing display panel module is in the off state (i.e., when the display is not lit), then the key is defined as the virtual key. If the pattern 100 on a key can be seen no matter whether the display panel module is in the off or on state, then the key is defined as the physical key (in this case, the pattern 100 may be printed on the cover glass 90).

In this embodiment, the electronic components 20 further comprise at least one input component 23 which may also receive the input of the user to communicate with the wireless communication device 1. The input component 23 may be a conventional button that is pressed by a user, or may be implemented as a capacitive touch-sensing component, a resistive touch-sensing component, an inductive touch-sensing component or an optical touch-sensing component. Moreover, a biometric identification module (not shown) may also be integrated into the input component 23 to increase the data protection within the wireless communication device 1. The cover glass 90 has an opening and the input component 23 is arranged in the opening. Understandably, the input sensing area 90A may be disposed in the peripheral area of the input component 23 to make it convenient for the user to operate.

With reference back to FIGS. 2 and 3, structurally, the capacitive touch-sensing component 40 may comprise a sensing layer 41, a dielectric layer 42 and a ground layer 43. The dielectric layer 42 is disposed between the sensing layer 41 and the ground layer 43. In other words, the sensing layer 41, the dielectric layer 42 and the ground layer 43 are stacked sequentially. In other embodiments, the dielectric layer 42 may also surround the sensing layer 41, and the ground layer 43 then surrounds the dielectric layer 42, so the dielectric layer 42 is still disposed between the sensing layer 41 and the ground layer 43.

The sensing layer 41 may be made of a conductor material (e.g., a metal layer such as a copper foil or an oxide such as indium tin oxide). The dielectric layer 42 may be made of a dielectric material (e.g., plastic, resin, glass or the like) or may comprise a hollow portion to use air as the dielectric material. The ground layer 43 may be made of a conductor and may further have a mesh structure. In other embodiments, the ground layer 43 may not have a mesh structure. The ground layer 43 may be called a second ground layer, while the ground layer 11 of the aforesaid circuit board 10 may be called a first ground layer for distinguishing between the two ground layers.

The sensing layer 41 may be electrically connected to another end 32B of the touch-sensing signal conducting wire 32. The ground layer 43 may be electrically connected to another end 31B of the ground conducting wire 31. Thus, when the capacitance value between the sensing layer 41 and the ground layer 43 varies, the corresponding touch-sensing signal can be transmitted to the touch-sensing signal module 22 through the touch-sensing signal conducting wire 32.

The antenna component 50 is configured to receive and/or transmit an RF signal of a specific frequency, and it structurally comprises a feed point 51 and a radiating body 52. The feed point 51 is disposed on the ground layer 43 of the capacitive touch-sensing component 40 and is electrically connected to another end 33B of the RF signal conducting wire 33. In other words, the feed point 51 may be defined as a position at which the other end 33B of the RF signal conducting wire 33 is disposed on the ground layer 43. The RF signal is fed into the ground layer 43 via the feed point 51. The feed point 51 and the other end 31B of the ground conducting wire 31 are located at different positions of the ground layer 43 and are spaced apart from each other.

The radiating body 52 comprises at least a part or all of the ground layer 43 to use the ground layer 43 to receive or transmit electromagnetic waves. That is, the RF signal entering into the ground layer 43 via the feed point 51 will be transmitted in the ground layer 43 and generates an electromagnetic wave. On the other hand, the electromagnetic wave in the environment, when it comes into contact with the ground layer 43, can generate the RF signal in the ground layer 43. Then, the RF signal enters into the RF signal module 21 through the feed point 51 and the RF signal conducting wire 33. Therefore, a part of the ground layer 43 through which the RF signal propagates may be defined as the radiating body 52.

The RF signal not only radiates in the ground layer 43 but also in the RF signal conducting wire 33 and the ground conducting wire 31, so the RF signal conducting wire 33 and the ground conducting wire 31 may also be regarded as another part comprised in the radiating body 52. Thus, the total radiating path of the antenna component 50 may be defined starting from an end 33A of the RF signal conducting wire 33, passing through a part of the ground layer 43 and terminating at an end 31A of the ground conducting wire 31. By adjusting the length of the radiating path (e.g., changing the position of the feed point 51, changing the length of the RF signal conducting wire 33 or the ground conducting wire 31 or the like), the resonance frequency of the radiating body 52 can be changed to obtain the desired frequency. Additionally, since the ground conducting wire 31 may also be a part of the radiating body 52, the radiating body 52 as a whole can be viewed as a loop antenna, of which the radiating path corresponds with ½ of the wavelength.

As can be known from the above descriptions, the wireless communication device 1 in this embodiment has the antenna component 50 integrated with the input component (i.e., the capacitive touch-sensing component) 40, and directly uses the ground layer 43 of the capacitive touch-sensing component 40 to receive or transmit the electromagnetic wave. Thus, the antenna component 50 and the capacitive touch-sensing component 40 can be accommodated in the same space and no additional space is required to accommodate one of the two components, which facilitates the size reduction or space utilization of the wireless communication device 1.

As shown in FIG. 1, the wireless communication device 1 in this embodiment may further comprise a plurality of signal filters 60 to reduce or prevent the interference to the RF signal module 21 from the touch-sensing signal, or the interference to the touch-sensing signal module 22 from the RF signal. The signal filters 60 (also known as filters) may comprise a touch-sensing signal filter 61 and/or an RF signal filter 62.

The touch-sensing signal filter 61 may be electrically connected to the RF signal conducting wire 33 in series and has a relatively large impendence for a DC (direct current) or low-frequency touch-sensing signal to block the touch-sensing signal from propagating therethrough. In this way, the touch-sensing signal generated by the capacitive touch-sensing component 40 cannot propagate through the touch-sensing signal filter 61, and thus, cannot enter into the RF signal module 21 through the RF signal conducting wire 33. Therefore, the RF signal module 21 will not be influenced by the touch-sensing signal.

The touch-sensing signal filter 61 has a relatively small impedance for the high-frequency RF signal, so it will not block the RF signal from passing therethrough. Therefore, the RF signal will not be blocked from passing through the RF signal conducting wire 33 due to the presence of the touch-sensing signal filter 61. The touch-sensing signal filter 61 may comprise electronic components such as a capacitor (e.g., a capacitor connected in series), which may present an open-circuited state for the touch-sensing signal, but a short-circuited state for the RF signal.

The RF signal filter 62 may be electrically connected to the touch-sensing signal conducting wire 32 in series and has a relatively large impendence for a high-frequency RF signal to block the RF signal from propagating therethrough. In this way, the RF signal generated by the antenna component 50 cannot propagate through the RF signal filter 62, and thus, cannot enter into the touch-sensing signal module 22 through the touch-sensing signal conducting wire 32. Therefore, the touch-sensing signal module 22 will not be influenced by the RF signal.

The RF signal filter 62 has a relatively small impedance for the DC or low-frequency touch-sensing signal, so it will not block the touch-sensing signal from passing therethrough. Therefore, the touch-sensing signal will not be blocked from passing through the touch-sensing signal conducting wire 32 due to the presence of the RF signal filter 62. The RF signal filter 62 may comprise electronic components such as an inductor (e.g., an inductor connected in series), which may present an open-circuited state for the RF signal but a short-circuited state for the touch-sensing signal.

According to the above descriptions, the touch-sensing signal filter 61 and the RF signal filter 62 can increase the reliability of the RF signal module 21 and the touch-sensing signal module 22 respectively.

Figure 7:
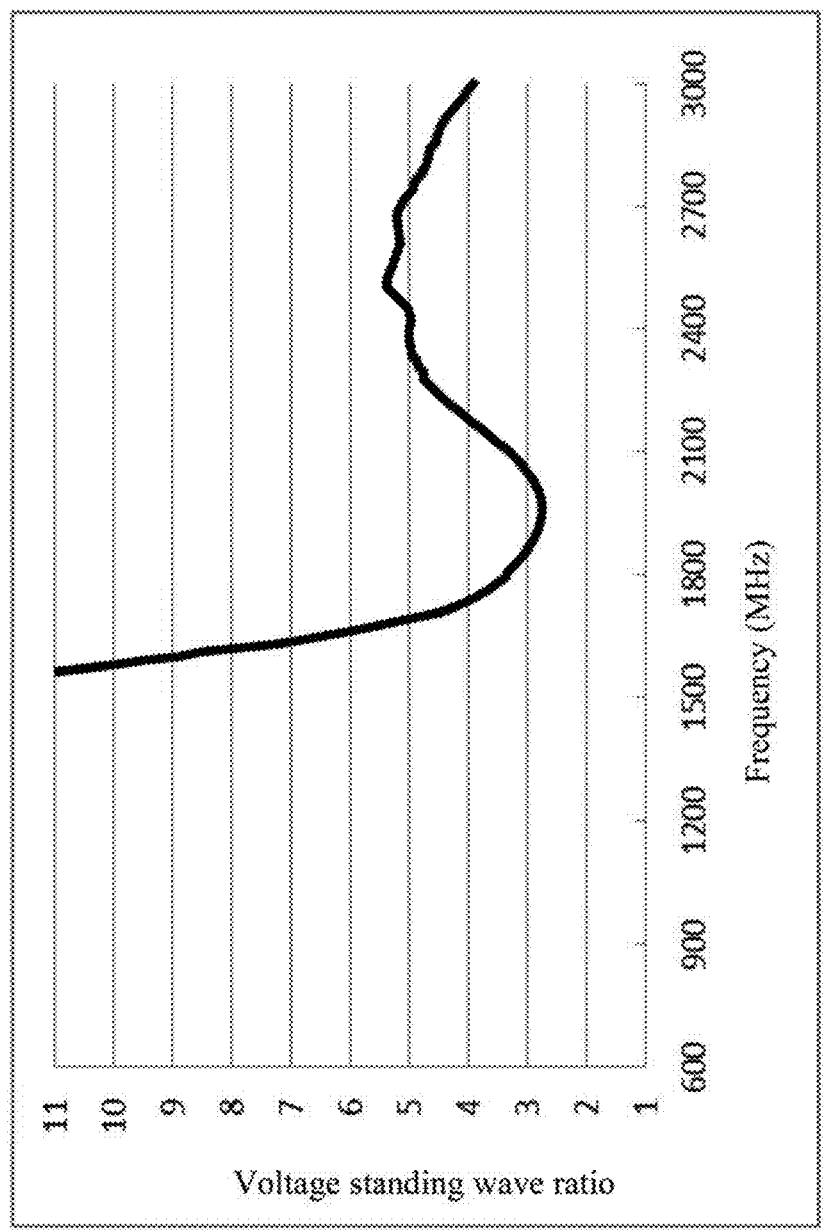
FIG. 7 is a schematic view illustrating the relationships between the frequency and the voltage standing wave ratio of the wireless communication device according to the first preferred embodiment of the present invention.

As an example of a practical test, the wireless communication device 1 is applied to a mobile phone with a size of 144.6 mm×69.7 mm×9.61 mm. The ground layer 43 has a size of 6 mm×17 mm×0.1 mm. The impedance matching circuit 212 is a ground capacitor connected in parallel (with a capacitance value of 0.8 pF). The touch-sensing signal filter 61 is a capacitor with a capacitance value of 1.8 pF, and the RF signal filter 62 is an inductor with an inductance value of 10 nH. The measured relationships between the frequency (MHz) and the voltage standing wave ratio (VSWR) are as shown in FIG. 7, and the relationships between the frequency (MHz) and the efficiency (%) are as shown in the following table.

| Frequency | 1710.2 | 1747.8 | 1784.8 | 1805.2 | 1850.2 | 1880 | 1909.8 | 1930.2 |
|---|---|---|---|---|---|---|---|---|
| Efficiency | 11.19 | 11.87 | 12.05 | 12.27 | 13.06 | 15.60 | 16.63 | 17.95 |
| Frequency | 1960 | 1989.8 | 2010 | 2025 | 2110 | 2140 | 2167.6 | 2300.8 |
| Efficiency | 17.92 | 17.74 | 17.04 | 16.81 | 15.48 | 15.32 | 16.16 | 17.85 |
| Frequency | 2350 | 2399.2 | 2500 | 2540 | 2580 | 2610 | 2650 | 2690 |
| Efficiency | 16.27 | 17.07 | 13.77 | 14.11 | 11.97 | 10.33 | 11.56 | 9.95 |

As can be known from the above table, the efficiency of each of the frequency bands between the middle frequency (1700 MHz) and the high frequency (2700 MHz) is generally greater than 10%, which means that the wireless communication device 1 has good efficiency in those frequencies and is suitable for use in the carrier aggregation (CA) technology. Thus, the wireless communication device 1 can operate in a plurality of frequency bands (e.g., B3, B2, B1, B4, B25, B30, B38, B39, B40, B41, B7 and WIFI 2.4G) of the Long-Term Evolution (LTE).

What is described above is the technical content of the wireless communication device 1, and the technical content of the wireless communication device 1 according to other embodiments of the present invention will be described hereinafter. Cross-references may be made between technical contents of the wireless communication device 1 of different embodiments, so identical descriptions will be omitted or simplified.

Figure 4:
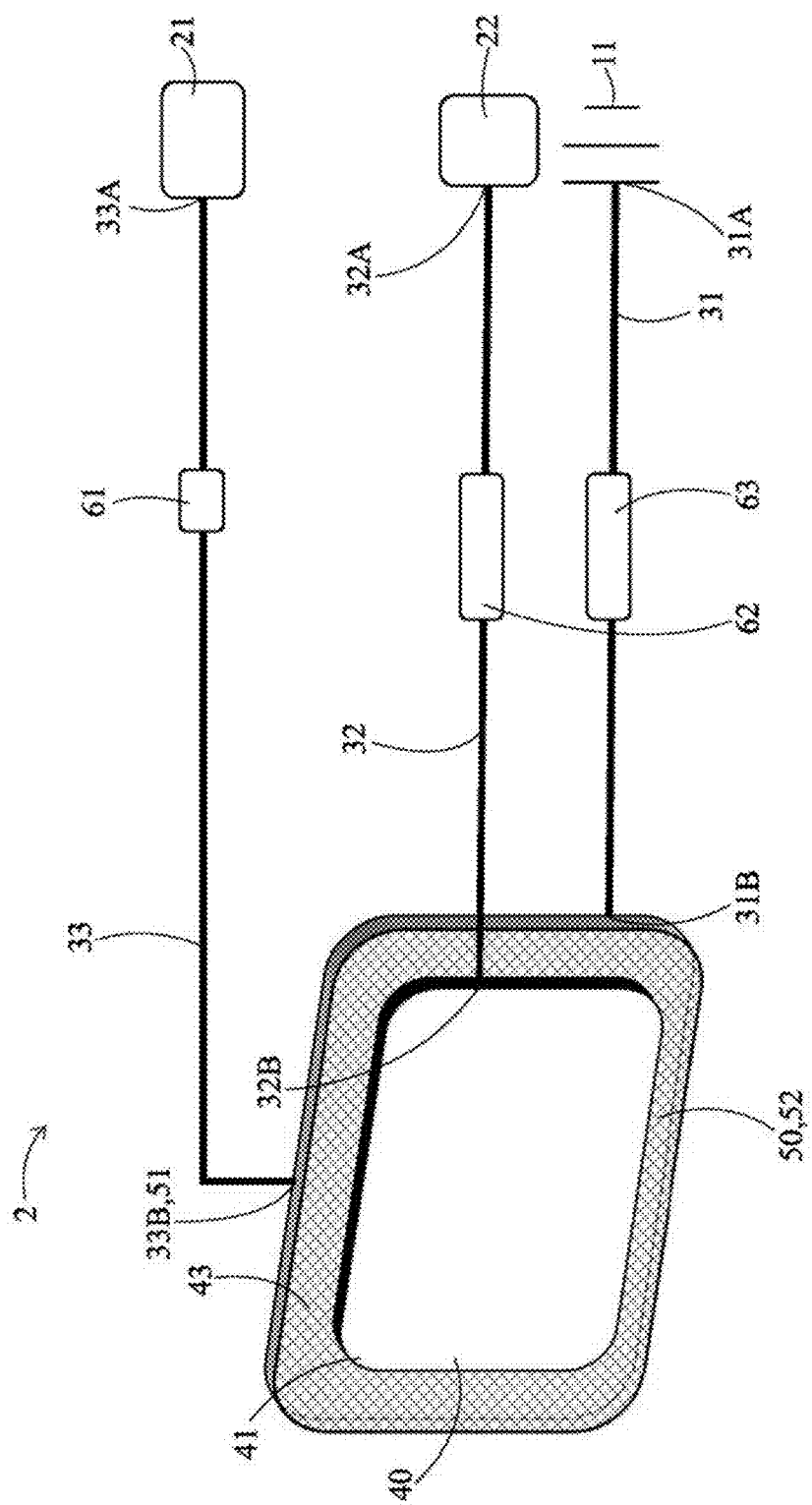
FIG. 4 is a schematic view of parts of components of a wireless communication device according to the second preferred embodiment of the present invention.

FIG. 4 illustrates a schematic view of a wireless communication device 2 according to the second preferred embodiment of the present invention. The wireless communication device 2 is similar to the aforesaid wireless communication device 1, but the feed point 51 of the antenna component 50 of the wireless communication device 2 may be disposed on the ground layer 43 at a position further from the another end 31B of the ground conducting wire 31 to increase the radiating path. The radiating path can be changed by adjusting the position of the feed point 51 (or the other end 31B) on the ground layer 43.

Additionally, the wireless communication device 2 may further comprise another RF signal filter 63 that is electrically connected to the ground conducting wire 31 to block the RF signal from propagating through the ground conducting wire 31. The RF signal filter 63 may comprise electronic components such as an inductor (e.g., an inductor connected in series), which may present an open-circuited state for the RF signal. Therefore, the RF signal entering into the ground layer 43 (the radiating body 52) from the feed point 51 cannot propagate towards the ground layer 11 of the circuit board 10 through the ground conducting wire 31.

In this case, it is difficult to use the ground conducting wire 31 as a part of the radiating body 52, so the radiating body 52 as a whole can be viewed as a monopole antenna, of which the radiating path corresponds to ¼ of the wavelength.

Figure 5:
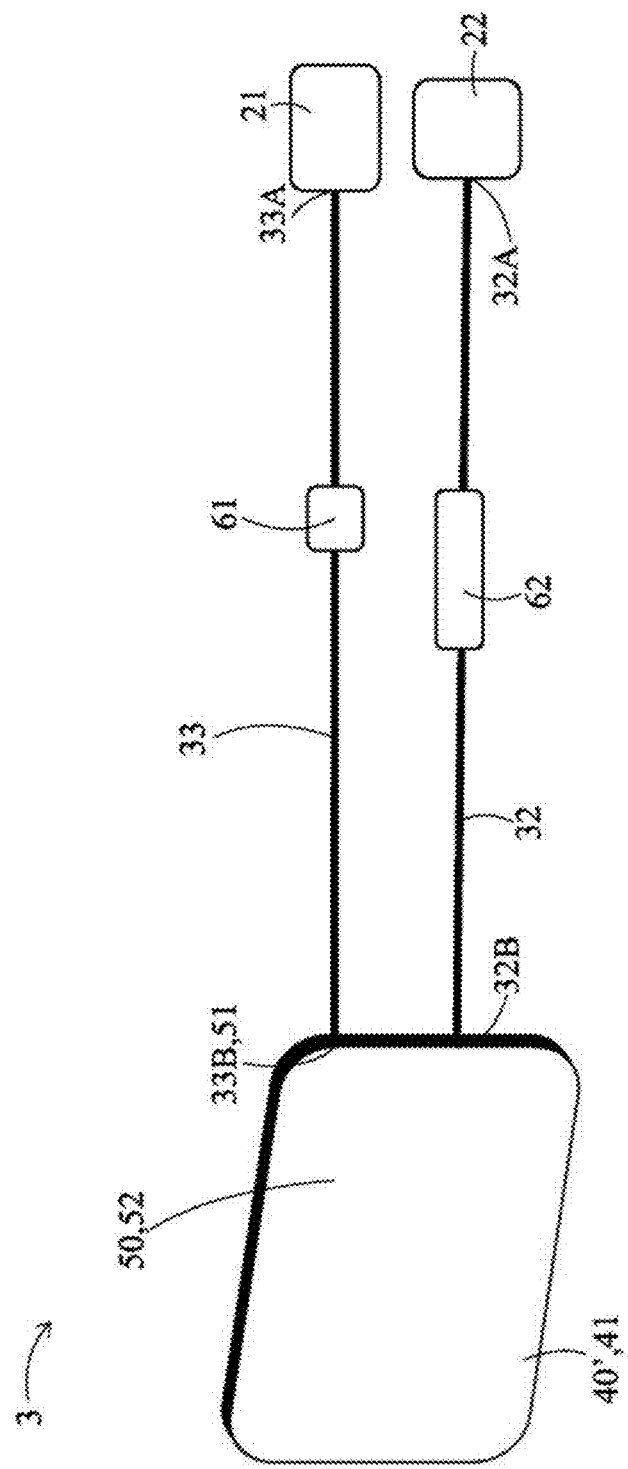
FIG. 5 is a schematic view of parts of components of a wireless communication device according to the third preferred embodiment of the present invention.

FIG. 5 is a schematic view of a wireless communication device 3 of the third preferred embodiment of the present invention. The wireless communication device 3 mainly differs from the aforesaid wireless communication devices 1 and 2 in that the wireless communication device 3 uses the sensing layer 41 of the capacitive touch-sensing component 40' as the radiating body 52.

Particularly, in the wireless communication device 3, in addition to the other end 32B of the touch-sensing signal conducting wire 32, the other end 33B of the RF signal conducting wire 33 is also electrically connected to the sensing layer 41 so that the feed point 51 of the antenna component 50 is disposed on the sensing layer 41. The radiating body 52 comprises at least a part of the sensing layer 41. In this way, the RF signal module 21 may feed the RF signal into the sensing layer 41 via the feed point 51 to generate the electromagnetic wave in the sensing layer 41. Alternatively, the electromagnetic wave in the environment can be received by the sensing layer 41 to generate the RF signal. The RF signal is then transmitted to the RF signal module 21 via the feed point 51 and the RF signal conducting wire 33. Similarly, the RF signal not only radiates in the sensing layer 41 but also in the RF signal conducting wire 33, so the RF signal conducting wire 33 may also be regarded as another part comprised in the radiating body 52. Thus, the total radiating path of the antenna component 50 may be defined starting from an end 33A of the RF signal conducting wire 33, passing through a part of the sensing layer 41 and then terminating at the sensing layer 41.

As shown in FIG. 1, since the sensing layer 41 (the radiating body 52) is not electrically connected to the ground layer 11 of the circuit board 10, the RF signal in the sensing layer 41 will not be transmitted towards the ground layer 11 of the circuit board 10. Therefore, the radiating body 52 as a whole can be viewed as a monopole antenna, of which the radiating path corresponds to ¼ of the wavelength. The wireless communication device 3 may also comprise a touch-sensing signal filter 61 and an RF signal filter 62 to reduce or prevent the interference to the RF signal module 21 from the touch-sensing signal, or the interference to the touch-sensing signal module 22 from the RF signal.

It shall be additionally appreciated that the antenna component 50 uses the sensing layer 41 of the capacitive touch-sensing component 40' as the radiating body 52, so the capacitive touch-sensing component 40' may not comprise a ground layer without influencing the constitution of the antenna component 50. In other words, even if the capacitive touch-sensing component 40' does not have a ground layer, the antenna component 50 may also be integrated into the capacitive touch-sensing component 40'.

Figure 6:
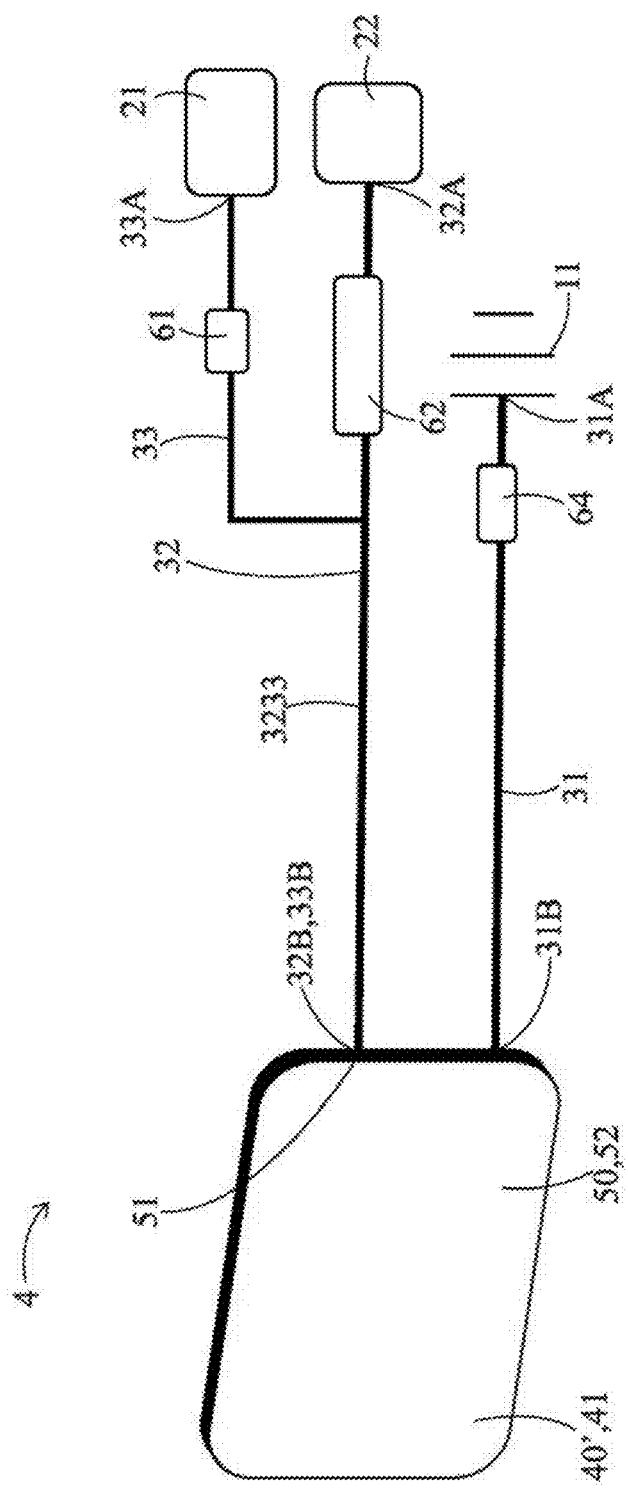
FIG. 6 is a schematic view of parts of components of a wireless communication device according to the fourth preferred embodiment of the present invention.

FIG. 6 is a schematic view of a wireless communication device 4 according to the fourth preferred embodiment of the present invention. The wireless communication device 4 and the aforesaid wireless communication device 3 are similar to each other and all use the sensing layer 41 of the capacitive touch-sensing component 40' as the radiating body 52. The difference between the aforesaid two wireless communication devices lies in that the RF signal conducting wire 33 and the touch-sensing signal conducting wire 32 of the wireless communication device 4 have a common section 3233. The RF signal conducting wire 33 and the touch-sensing signal conducting wire 32 are actually the same conducting wire in the common section 3233 and are two conducting wires outside the common section 3233. The other end 33B of the RF signal conducting wire 33 and the other end 32B of the touch-sensing signal conducting wire 32 are disposed on the common section 3233, so the RF signal conducting wire 33 and the touch-sensing signal conducting wire 32 are electrically connected in parallel to the sensing layer 41. In other words, the RF signal conducting wire 33 and the touch-sensing signal conducting wire 32 are electrically connected to the sensing layer at the same position.

Due to the arrangement of the common section 3233, the circuit layout of the wireless communication device 4 can be simplified. If the wireless communication device 4 comprises the touch-sensing signal filter 61 and the RF signal filter 62, then the touch-sensing signal filter 61 and the RF signal filter 62 will be located outside the common section 3233 to prevent the touch-sensing signal or the RF signal from being unable to propagate through the common section 3233.

Another difference between the wireless communication device 4 and the wireless communication device 3 lies in that the wireless communication device 4 further comprises a ground conducting wire 31 and another touch-sensing signal filter 64. The ground conducting wire 31 has an end 31A electrically connected to the ground layer 11 of the circuit board 10 and the other end 31B electrically connected to the sensing layer 41 of the capacitive touch-sensing component 40' and spaced apart from the feed point 51. The touch-sensing signal filter 64 is electrically connected to the ground conducting wire 31 and may block the touch-sensing signal but allow the RF signal to propagate therethrough. Therefore, the ground conducting wire 31 may be a part of the radiating body 52 so that the antenna component 50 is a loop antenna as a whole. Moreover, since the touch-sensing signal filter 64 can block the touch-sensing signal from being transmitted to the ground layer 11 through the ground conducting wire 31, the touch-sensing signal can still be received and processed by the touch-sensing signal module 22.

According to the above descriptions, the wireless communication devices provided in the embodiments of the present invention have an antenna component integrated with at least one input component (e.g., a capacitive touch-sensing component, a resistive touch-sensing component, an inductive touch-sensing component or an optical touch-sensing component), and a sensing layer comprised in the input components. The sensing layer may serve as the radiating body of the antenna component, thereby, saving the space occupied by the antenna component. Additionally, the antenna component may further operate at a plurality of frequencies to serve as a diversity antenna that adopts the CA technology. Moreover, due to the arrangement of the signal filters, the touch-sensing signal will not influence the RF signal module and the RF signal will not influence the touch-sensing signal module, thereby, increasing the operation reliability or the like.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A wireless communication device, comprising:
a circuit board, comprising a first ground layer;
a first input component, comprising a sensing layer, a dielectric layer and a second ground layer, the sensing layer being electrically connected to the first ground layer, the dielectric layer being disposed between the sensing layer and the second ground layer, and the second ground layer being electrically connected to the first ground layer; and
an antenna component, comprising a feed point and a radiating body, the feed point being disposed on the second ground layer of the first input component, and at least parts of the second ground layer forming a first part of the radiating body.

2. The wireless communication device of claim 1, further comprising a ground conducting wire having a first end electrically connected to the first ground layer and a second end electrically connected to the second ground layer.

3. The wireless communication device of claim 2, further comprising a radio frequency (RF) signal conducting wire having a first end electrically connected to the first ground layer and a second end electrically connected to the second ground layer.

4. The wireless communication device of claim 3, wherein the ground conducting wire and the RF signal conducting wire form a second part of the radiating body.

5. The wireless communication device of claim 4, further comprising:
an RF signal module and a touch-sensing signal module, both being disposed on the circuit board; and
a touch-sensing signal conducting wire having a first end electrically connected to the touch-sensing signal module and a second end electrically connected to the sensing layer, and the first end of the RF signal conducting wire being electrically connected to the RF signal module.

6. The wireless communication device of claim 5, further comprising an RF signal filter, wherein the RF signal filter is electrically connected to the touch-sensing signal conducting wire to block an RF signal from propagating through the touch-sensing signal conducting wire.

7. The wireless communication device of claim 6, wherein the RF signal filter comprises an inductor.

8. The wireless communication device of claim 3, wherein the touch-sensing signal conducting wire and the RF signal conducting wire are disposed on one of the circuit board and a flexible printed circuit substrate.

9. The wireless communication device of claim 3, further comprising a touch-sensing signal filter, wherein the touch-sensing signal filter is electrically connected to the RF signal conducting wire to block an RF signal from propagating through the RF signal conducting wire.

10. The wireless communication device of claim 9, wherein the touch-sensing signal filter comprises a capacitor.

11. The wireless communication device of claim 2, further comprising an RF signal filter, wherein the RF signal filter is electrically connected to the ground conducting wire to block an RF signal from propagating through the ground conducting wire.

12. The wireless communication device of claim 1, further comprising:
a cover glass, wherein an input sensing area is formed by the first input component on the cover glass.

13. The wireless communication device of claim 12, wherein the first input component comprises one of a capacitive touch-sensing component, a resistive touch-sensing component, an inductive touch-sensing component and an optical touch-sensing component.

14. The wireless communication device of claim 12, further comprising:
a second input component, wherein the cover glass has an opening and the second input component is arranged in the opening.

15. The wireless communication device of claim 14, wherein the input sensing area is disposed in a surrounding area of the second input component.

16. The wireless communication device of claim 14, wherein the second input component comprises a biometirc identification module.

17. A wireless communication device, comprising:
a circuit board, comprising a ground layer;
a touch-sensing signal conducting wire and an RF signal conducting wire, a first end of the touch-sensing signal conducting wire being electrically connected to the ground layer, and a first end of the RF signal conducting wire being electrically connected to the ground layer;
an input component, comprising a sensing layer which is electrically connected to a second end of the touch-sensing signal conducting wire; and
an antenna component, comprising a feed point and a radiating body, the feed point being disposed on the sensing layer of the input component, and a second end of the RF signal conducting wire being electrically connected to the sensing layer via the feed point, wherein at least parts of the sensing layer form a first part of the radiating body.

18. The wireless communication device of claim 17, wherein the input component comprises one of a capacitive touch-sensing component, a resistive touch-sensing component, an inductive touch-sensing component and an optical touch-sensing component.

19. The wireless communication device of claim 18, wherein the touch-sensing signal filter comprises a capacitor, and the RF signal filter comprises an inductor.

20. The wireless communication device of claim 17, further comprising a touch-sensing signal filter and an RF signal filter, wherein the touch-sensing signal filter is electrically connected to the RF signal conducting wire to block a touch-sensing signal from propagating through the RF signal conducting wire; and the RF signal filter is electrically connected to the touch-sensing signal conducting wire to block an RF signal from propagating through the touch-sensing signal conducting wire.

21. The wireless communication device of claim 17, wherein a second end of the touch-sensing signal conducting wire and a second end of the RF signal conducting wire are electrically connected in parallel to the sensing layer.

22. The wireless communication device of claim 17, further comprising a ground conducting wire having a first end electrically connected to the ground layer and a second end electrically connected to the sensing layer.

23. The wireless communication device of claim 22, wherein the ground conducting wire and the RF signal conducting wire form a second part of the radiating body.

\* \* \* \* \*